United States Patent
Sherigar et al.

(10) Patent No.: US 7,091,888 B1
(45) Date of Patent: Aug. 15, 2006

(54) RUN-LEVEL AND COMMAND SPLIT FIFO STORAGE APPROACH IN INVERSE QUANTIZATION

(75) Inventors: Bhaskar Sherigar, Bangalore (IN); Anand Tongle, Bangalore (IN)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 11/092,285

(22) Filed: Mar. 29, 2005

(51) Int. Cl.
*H03M 7/40* (2006.01)

(52) U.S. Cl. .......................... 341/65; 341/63
(58) Field of Classification Search ............. 341/55–70
See application file for complete search history.

(56) References Cited

U.S. PATENT DOCUMENTS

| | | | | |
|---|---|---|---|---|
| 5,220,325 A | * | 6/1993 | Ackland et al. | 341/67 |
| 5,598,155 A | * | 1/1997 | Ahn et al. | 341/67 |
| 5,617,094 A | * | 4/1997 | Kim | 341/200 |
| 5,818,363 A | * | 10/1998 | Kim | 341/63 |
| 5,969,650 A | * | 10/1999 | Wilson | 341/67 |

* cited by examiner

*Primary Examiner*—Lam T. Mai
(74) *Attorney, Agent, or Firm*—McAndrews, Held & Malloy, Ltd.

(57) ABSTRACT

Presented herein is a run-level split FIFO. According to one embodiment of the present invention, there is presented a method for inverse quantizing. The method comprising receiving a data word; detecting whether the data word comprises a command or run-level data; storing the command, if the data word comprises a command; and processing the run-level data, if the data word comprises run-level data.

12 Claims, 7 Drawing Sheets

500

| (0)...(5) | (6)...(11) | (12)....(27) | (28)...(33) | (34)...(39) | (40)...(56) |
|---|---|---|---|---|---|
| | | | | | |

600

RUN-LEVEL AND COMMAND SPLIT FIFO STORAGE APPROACH IN INVERSE QUANTIZATION

RELATED APPLICATIONS

[Not Applicable]

FEDERALLY SPONSORED RESEARCH OR DEVELOPMENT

[Not Applicable]

MICROFICHE/COPYRIGHT REFERENCE

[Not Applicable]

BACKGROUND OF THE INVENTION

Decoding compressed video data often includes inverse quantizing blocks of data comprising frequency coefficients that correspond to a region of a picture. According to certain standards, such as MPEG-2, Advanced Video Coding (AVC), and VC-9, the quantized frequency coefficients are scanned and coded using run-length codes.

Scanning is a process of placing the frequency coefficients that are most likely to be significant towards the beginning of a data structure and the frequency coefficients that are most likely to be zero toward the end of the data structure. Run length codes further reduce the amount of data required for the data structure.

Decoders often include an inverse quantizer for inverse quantizing the blocks of frequency coefficients. Block headers that are in the stream of data that include the frequency coefficients are usually processed by other portions of the video decoder. Thus, the frequency coefficients may be provided to the inverse quantizer after run-level decode without an indication of the beginning of the blocks.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

Presented herein is a run-level split FIFO.

According to one embodiment of the present invention, there is presented a method for inverse quantizing. The method comprises receiving a data word; detecting whether the data word comprises a command or run-level data; storing the command, if the data word comprises a command; and processing the run-level data, if the data word comprises run-level data.

According to another embodiment of the present invention, there is presented an inverse quantizer. The inverse quantizer comprises an interface, a first memory, and a circuit. The interface receives a data word and detects whether the data word comprises a command or run-level data. The first memory stores the command, if the data word comprises a command. The circuit processes the run-level data, if the data word comprises run-level data.

These and other advantages and novel features of the present invention, as well as details of an illustrated embodiment thereof, will be more fully understood from the following description and drawings.

DETAILED DESCRIPTION OF THE INVENTION

Figure 1A:
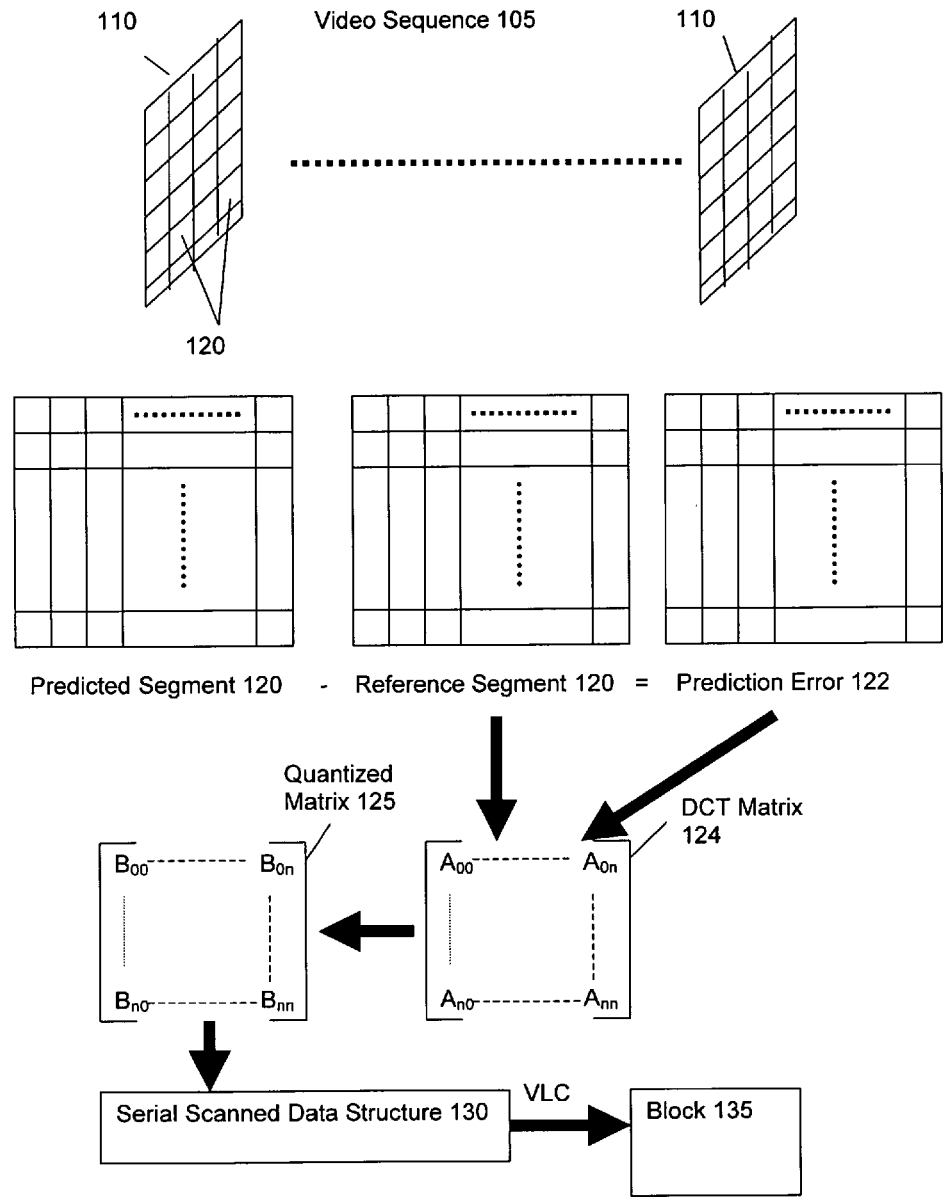
FIGS. 1A and 1B are block diagrams describing MPEG Formatting of a video.

Referring now to FIG. 1A, there is illustrated a block diagram describing MPEG formatting of a video sequence 105. A video sequence 105 comprises a series of frames 110. In a progressive scan, the frames 110 represent instantaneous images, while in an interlaced scan, the frames 110 comprises two fields each of which represent a portion of an image at adjacent times. Each frame comprises a two dimensional grid of pixels 115. The two-dimensional grid of pixels 115 can have 8×8, 8×4, 4×8 and 4×4 segments based on the block transform type in vc9, but in case of AVC it can have 8×8 and 4×4 video segments. MPEG-2 frame is divided into 8×8 segments 120.

The MPEG standard takes advantage of temporal redundancies between the frames with algorithms that use motion compensation based prediction. The frames 110 can be considered as snapshots in time of moving objects. With frames 110 occurring closely in time, it is possible to represent the content of one frame 110 based on the content of another frame 110, and information regarding the motion of the objects between the frames 110.

Accordingly, segments 120 of one frame 110 (a predicted frame) are predicted by searching segment 120 of a reference frame 110 and selecting the segment 120 in the reference frame most similar to the segment 120 in the predicted frame. A motion vector indicates the spatial displacement between the segment 120 in the predicted frame (predicted segment) and the segment 120 in the reference frame (reference segment). The difference between the pixels in the predicted segment 120 and the pixels in the reference segment 120 is represented by a matrix type among 8×8, 8×4, 4×8 and 4×4 matrix known as the prediction error 122. The predicted segment 120 can be represented by the prediction error 122, and the motion vector.

In MPEG-2, the frames 110 can be represented based on the content of a previous frame 110, based on the content of a previous frame and a future frame, or not based on the content of another frame. In the case of segments 120 in frames not predicted from other frames, the pixels from the segment 120 are transformed to the frequency domain using DCT, thereby resulting in a DCT matrix 124. For predicted segments 120, the prediction error matrix is converted to the frequency domain using DCT, thereby resulting in a DCT matrix 124.

The segment 120 is small enough so that most of the pixels are similar, thereby resulting in more frequency coefficients of smaller magnitude. In a predicted segment 120, the prediction error matrix is likely to have low and fairly consistent magnitudes. Accordingly, the higher frequency coefficients are also likely to be small or zero. Therefore, high frequency components can be represented with less accuracy and fewer bits without noticeable quality degradation.

The coefficients of the DCT matrix 124 are quantized, using a higher number of bits to encode the lower frequency coefficients 124 and fewer bits to encode the higher frequency coefficients 124. The fewer bits for encoding the higher frequency coefficients 124 cause many of the higher frequency coefficients 124 to be encoded as zero. The foregoing results in a quantized matrix 125.

As noted above, the higher frequency coefficients in the quantized matrix 125 are more likely to contain zero value. In the quantized frequency components 125, the lower frequency coefficients are concentrated towards the upper left of the quantized matrix 125, while the higher frequency coefficients 125 are concentrated towards the lower right of the quantized matrix 125. In order to concentrate the non-zero frequency coefficients, the quantized frequency coefficients 125 are scanned starting from the top left corner and ending at the bottom right corner, thereby forming a serial scanned data structure 130. Various type of scanning is used based on the type of video standard being used.

The serial scanned data structure 130 is encoded using variable length coding, thereby resulting in blocks 135. The VLC specifies the number of zeroes preceding a non-zero frequency coefficient. A "run" value indicates the number of zeroes and a "level" value is the magnitude of the nonzero frequency component following the zeroes. After all non-zero coefficients are exhausted, an end-of-block signal (EOB) indicates the end of the block 135.

Figure 1B:
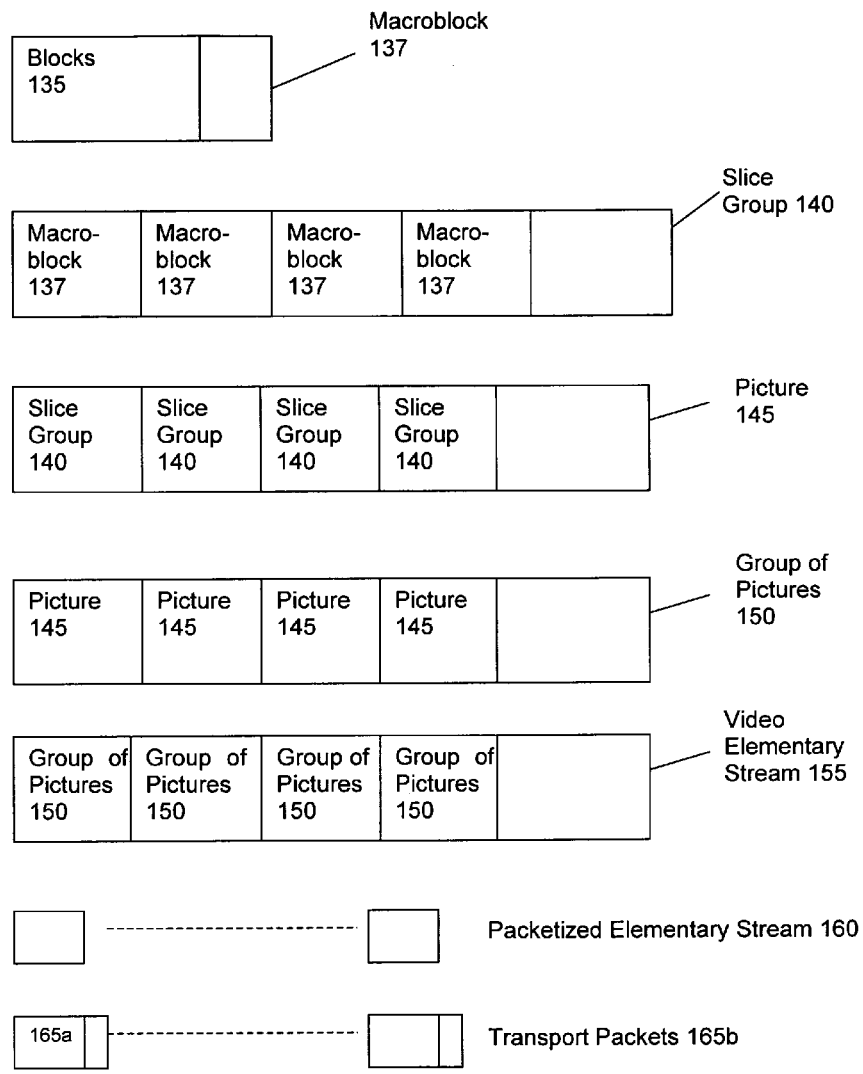

Continuing to FIG. 1B, a block 135 forms the data portion of a macroblock structure 137. The macroblock structure 137 also includes additional parameters, including motion vectors.

Blocks 135 representing a frame are grouped into different slice groups 140. In MPEG-2, each slice group 140 contains contiguous blocks 135. The slice group 140 includes the macroblocks representing each block 135 in the slice group 140, as well as additional parameters describing the slice group. Each of the slice groups 140 forming the frame form the data portion of a picture structure 145. The picture 145 includes the slice groups 140 as well as additional parameters. The pictures are then grouped together as a group of pictures 150. Generally, a group of pictures includes pictures representing reference frames (reference pictures), and predicted frames (predicted pictures) wherein all of the predicted pictures can be predicted from the reference pictures and other predicted pictures in the group of pictures 150. The group of pictures 150 also includes additional parameters. Groups of pictures are then stored, forming what is known as a video elementary stream 155.

The video elementary stream 155 is then packetized to form a packetized elementary sequence 160. Each packet is then associated with a transport header 165a, forming what are known as transport packets 165b.

Figure 2:
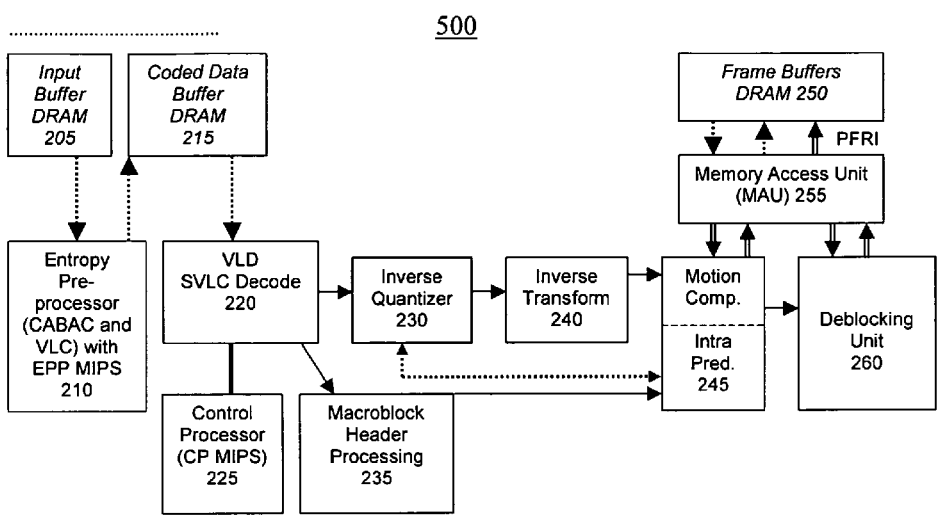
FIG. 2 is a block diagram of an exemplary video decoder configured in accordance with an embodiment of the present invention.

Referring now to FIG. 2, there is illustrated a block diagram describing an exemplary video decoder system 200 in accordance with an embodiment of the present invention.

The video decoder 200 comprises an input buffer DRAM 205, an entropy pre-processor 210, a coded data buffer DRAM 215, a variable length code decoder 220, a control processor 225, an inverse quantizer 230, a macroblock header processor 235, an inverse transformer 240, a motion compensator and intra picture predictor 245, frame buffers 250, a memory access unit 255, and a deblocker 260.

The input buffer DRAM 205, entropy pre-processor 210, coded data buffer DRAM 215, and variable length code decoder 220 together decode the variable length coding associated with the video data, resulting in pictures 100 represented by macroblocks 120.

The inverse quantizer 230 inverse quantizes blocks 135 of quantized frequency coefficients 125, resulting in frequency coefficients 124. The macroblock header processor 235 examines side information, such as parameters that are encoded with the macroblocks 137.

The inverse transformer 240 transforms the blocks 130 of frequency coefficients 124, thereby resulting in the prediction error. The motion compensator and intrapicture predictor 245 decodes the macroblock 137 pixels from the prediction error. The decoded macroblocks 137 are stored in frame buffers 250 using the memory access unit 255. A deblocker 260 is used to deblock adjacent macroblocks 137.

The variable length code decoder 220 quantized frequency coefficients 125 are provided to the inverse quantizer 230 in the form of 56-bit wide double data words. The data words can include run-length coded data or commands.

Figure 3:
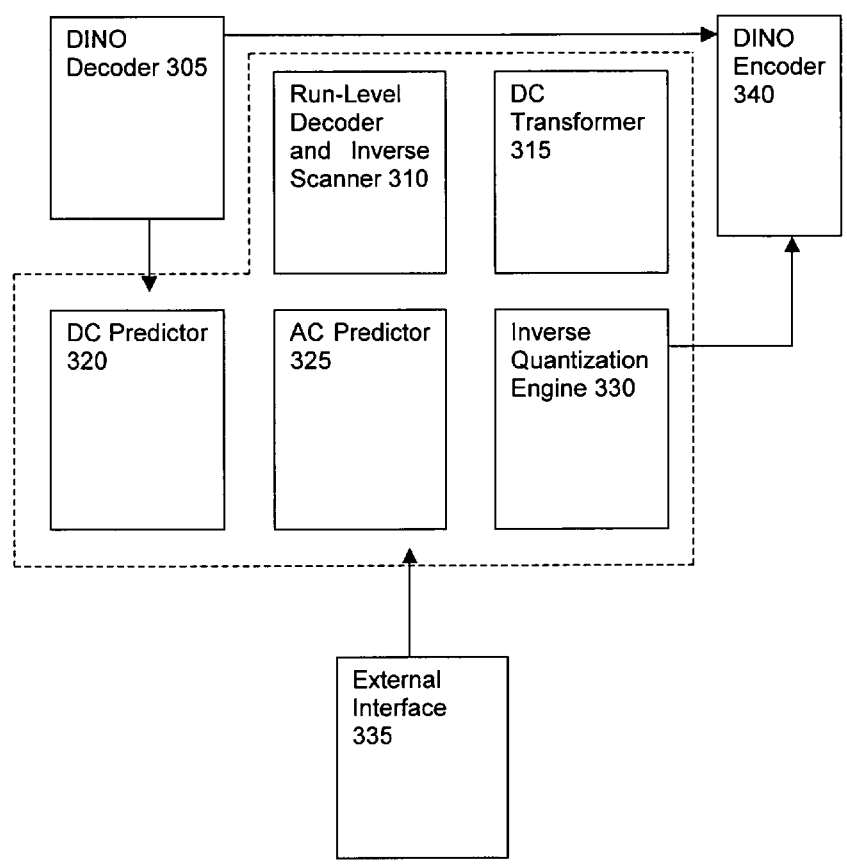
FIG. 3 is a block diagram describing an exemplary inverse quantizer in accordance with an embodiment of the present invention.

Referring now to FIG. 3, there is illustrated a block diagram describing an exemplary inverse quantizer 230 in accordance with an embodiment of the present invention. The inverse quantizer 230 comprises a Data input and Output Decoder 305, a run level decoder and inverse scanner 310, a DC transformer 315, a DC predictor 320, an AC predictor 325, an inverse quantization engine 330, external interfaces 335, and a DINO encoder 340.

The external interfaces 335 initialize the inverse quantizer 230 at every picture header level with the parameters. The run-level decode and inverse scanner 310 does the "zero filling" operation decided by the run count of run pairs and inverse scans by providing a correct address of a buffer based on a look-up table.

AC and DC prediction can be used in certain standards such as VC-9. Where DC prediction is enabled, the DC predictor 320 performs the DC prediction functions. Where AC prediction is enabled, the AC predictor performs 325 the AC prediction functions.

Some standards, such as Advanced Video Coding, use the Hadamard transformation. The DC transformer 315 performs the inverse Hadamard transformation of DC coefficients. The inverse quantization engine 330 inverse quantizes the frequency coefficients. The DINO encoder 340 packs the inverse quantized coefficients in the format of DINO data words and sends them to the inverse transformer 240.

Figures 4, 5:
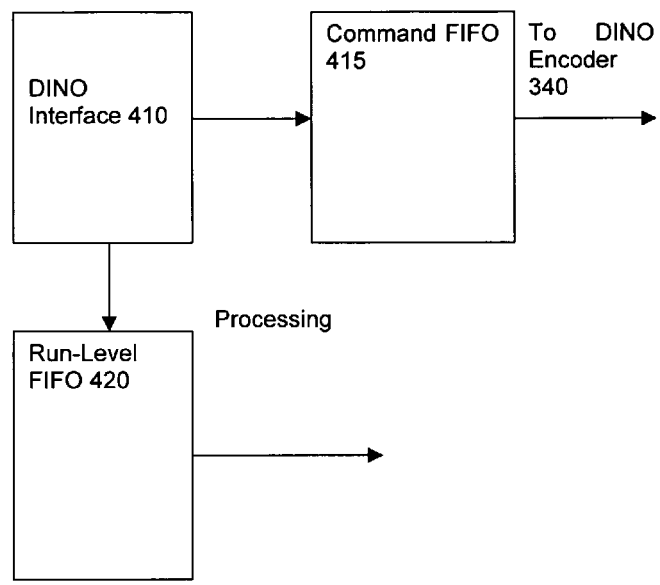
FIG. 4 is a block diagram describing an exemplary DINO decoder in accordance with an embodiment of the present invention.
FIG. 5 is a block diagram of a data word storing run-level data in accordance with an embodiment of the present invention.

Referring now to FIG. 4, there is illustrated a block diagram describing a DINO decoder 305 in accordance with an embodiment of the present invention. The DINO decoder 305 comprises a double DINO interface 410, a command FIFO 415, and a run-level FIFO 420.

The DINO decoder 305 receives 56-bit double words that can either comprise commands or data. The Double DINO interface 410 detects whether a double word comprises a command or data. Where the Double DINO interface 410 detects that the double word comprises a command, the double DINO interface 410 pushes the command onto the command FIFO 415. Where the double DINO interface 410 detects that the double word comprises data, the double DINO interface 410 pushes the data onto the run-level FIFO 420.

The command FIFO 415 provides the commands directly to the DINO encoder 340. The run-level FIFO 420 provides the data along a data path that can include the DC predictor 320, an AC predictor 325, DC transformer 315 and inverse quantization engine 330.

Referring now to FIG. 5, there is illustrated a block diagram describing an exemplary 56-bit double word 500 for transferring data between the variable length code decoder 220 and the inverse quantizer 230. The data can comprise run level pairs.

The format of the double word 500 when transferring data is as follows:

| Bits | Numeric Reference | Field |
| --- | --- | --- |
| 0 ... 5 | 500 (0) ... 500 (5) | Opcode |
| 6 ... 11 | 500 (6) ... 500 (11) | Run Code |
| 12 ... 27 | 500 (12) ... 500 (27) | Level Code |
| 28 ... 33 | 500 (28) ... 500 (33) | Opcode |
| 34 ... 39 | 500 (34) ... 500 (39) | Run Code |
| 40 ... 56 | 500 (40) ... 500 (56) | Level Code |

Figure 6:
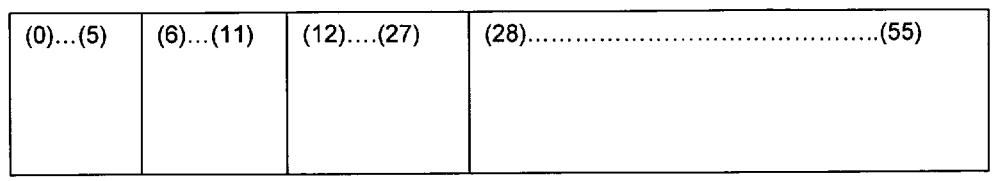
FIG. 6 is a block diagram of a data word storing a command in accordance with an embodiment of the present invention.
Figure 6:
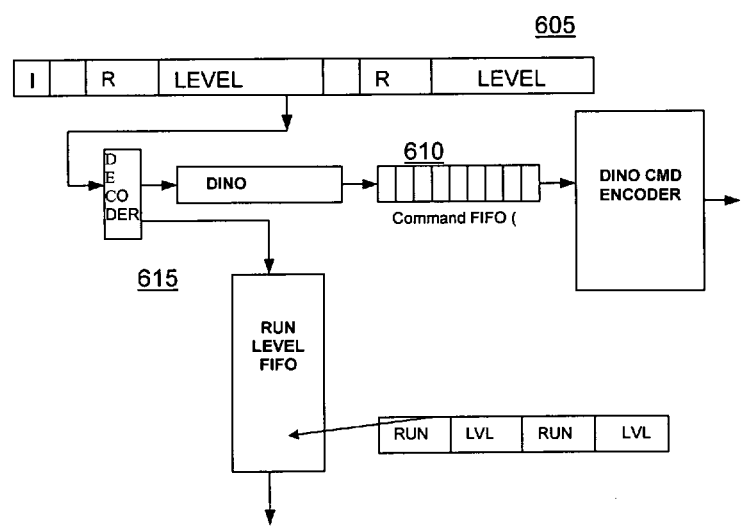

Referring now to FIG. 6, there is illustrated a block diagram describing an exemplary 56-bit word for transferring commands to the inverse quantizer 230 in accordance with an embodiment of the present invention. In order to structure the correct flow of the commands among the sub blocks of the video decoder, a common format is used. Additionally, there is a command word format to address the requisite information. The command format which supports many such commands naturally uses a wider number of bits, such as a 56-bit wide word format 605. To store such a wide command format it requires a larger memory storage. At mouth of the inverse quantizer these commands are decoded and identified as command words 610 and data words 615. The decoded command word is smaller in number of bits compared to the requirement of storing an entire command word. The same is true for the data word. The commands that are required to flow out of inverse quantizer are again encoded with the correct format and sent to the downstream blocks.

| Bits | Numeric Reference | Field |
| --- | --- | --- |
| 0 ... 5 | 600 (0) ... 600 (5) | Command Identifier |
| 6 ... 11 | 600 (6) ... 600 (27) | Command |
| 28 ... 55 | 600 (28) ... 600 (55) | Not Used |

The commands can include various macroblock level parameters and stream syntax that is used by the various sub blocks of the video decoder. Additionally, these commands may include block level information and flags when the decoder is decoding VC9 standard. The information included in the commands can include, for example, start of macroblock, macroblock type, AC/DC prediction flags, coded data pattern, and motion vectors.

Figure 7:
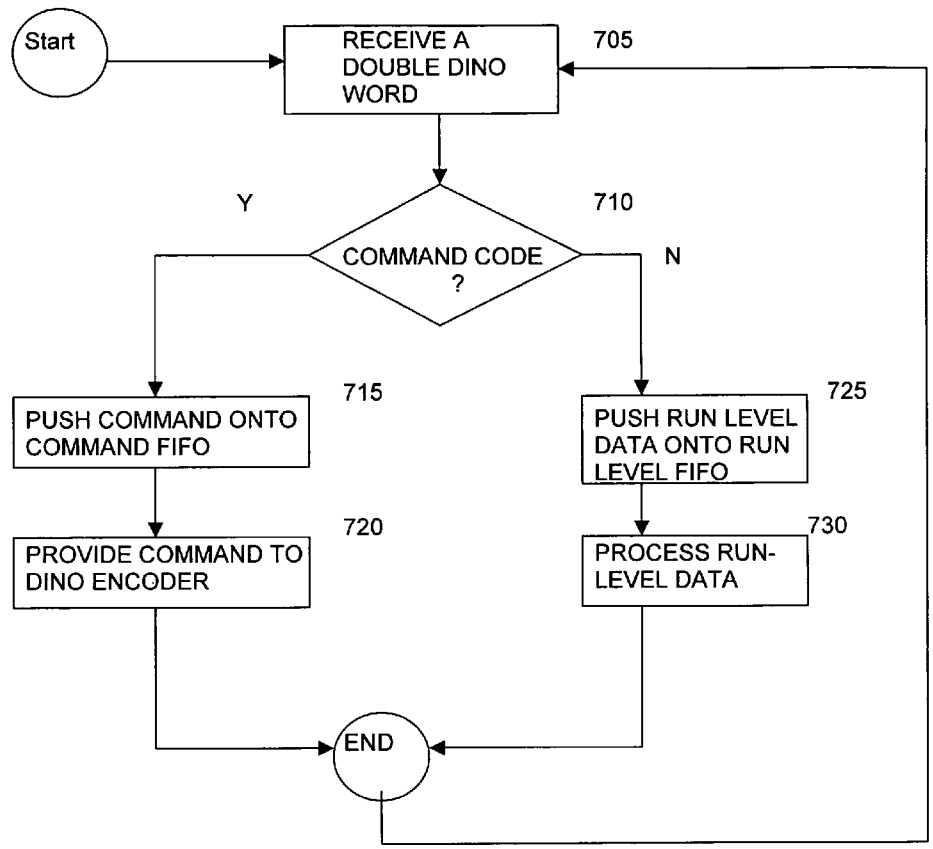
FIG. 7 is a flow diagram describing the operation of the inverse quantizer in accordance with an embodiment of the present invention.

Referring now to FIG. 7, there is illustrated a flow diagram describing the operation of the inverse quantizer in accordance with an embodiment of the present invention. At 705, the double DINO interface 410 receives a double DINO word 500. At 710, the double DINO interface 410 examines the double DINO word 500 for a command code at bits 500(0) . . . 500(5).

If at 710, the double DINO interface 415 finds the command code, at 715, the double DINO interface pushes the command onto the command FIFO 415. The command FIFO provides the command directly to the DINO encoder 340 at 720.

If at 710, the double DINO interface does not detect a command code, the DINO interface pushes (725) the run-level data onto the run-level FIFO 420. The run-level data is processed at 730. The processing can include run-level decoding and inverse scanning by run level decoder and inverse scanner 310, a DC transformation by DC transformer 315, a DC prediction by DC predictor 320, AC prediction by AC predictor 325, and inverse quantization by inverse quantization engine 330.

The degree of integration of the system may primarily be determined by speed and cost considerations. Because of the sophisticated nature of modern processor, it is possible to utilize a commercially available processor, which may be implemented external to an ASIC implementation. If the processor is available as an ASIC core or logic block, then the commercially available processor can be implemented as part of an ASIC device wherein certain functions can be implemented in firmware. In one embodiment, the foregoing can be integrated into an integrated circuit. Additionally, the functions can be implemented as hardware accelerator units controlled by the processor.

While the invention has been described with reference to certain embodiments, it will be understood by those skilled in the art that various changes may be made and equivalents may be substituted without departing from the scope of the invention. In addition, many modifications may be made to adapt particular situation or material to the teachings of the invention without departing from its scope. Therefore, it is intended that the invention not be limited to the particular embodiment(s) disclosed, but that the invention will include all embodiments falling within the scope of the appended claims.

What is claimed is:

1. A method for inverse quantizing, said method comprising:
    receiving a data word;
    detecting whether the data word comprises a command or run-level data;
    storing the command, if the data word comprises a command; and
    processing the run-level data, if the data word comprises run-level data, wherein processing the run-level data comprises run-level decoding the run-level data.

2. The method of claim 1, wherein the data word comprises a plurality of bits, and wherein detecting further comprises:
    examining a predetermined portion of the plurality of bits for a predetermined code.

3. The method of claim 1, wherein storing the command further comprises:
    pushing the command onto a command FIFO.

4. The method of claim 1, wherein storing the run-level data further comprises:
    pushing the run-level data onto a run-level FIFO.

5. The method of claim 1, wherein processing the run-level data further comprises inverse quantizing the run-level data.

6. The method of claim 1, wherein processing the run-level data further comprises at least one of inverse scanning the run-level data, DC transforming the run-level data, DC predicting the run-level data, and AC predicting the run-level data.

7. An inverse quantizer comprising:
an interface for receiving a data word and detecting whether the data word comprises a command or run-level data;
a first memory for storing the command, if the data word comprises a command; and
a circuit for processing the run-level data, if the data word comprises run-level data, wherein the circuit comprises a run-level decoder for run-level decoding the run-level data.

8. The inverse quantizer of claim 7, wherein the data word comprises a plurality of bits, and wherein detecting further comprises:

examining a predetermined portion of the plurality of bits for a predetermined code.

9. The inverse quantizer of claim 7, wherein the first memory comprises a command FIFO.

10. The inverse quantizer of claim 7, further comprising a run-level FIFO for storing the run-level data.

11. The inverse quantizer of claim 7, wherein the circuit comprises an inverse quantizer for inverse quantizing the run-level data.

12. The inverse quantizer of claim 7, further comprising at least one of:
an inverse scanner for inverse scanning the run-level data;
a DC transformer for DC transforming the run-level data;
a DC predictor for DC predicting the run-level data; and
an AC predictor for AC predicting the run-level data.

* * * * *